(12) United States Patent
Ciraldo et al.

(10) Patent No.: US 12,139,812 B2
(45) Date of Patent: Nov. 12, 2024

(54) METHOD OF GROWING BULK SINGLE CRYSTAL DIAMOND ON A SUBSTRATE IN A PRESCRIBED GAS ENVIRONMENT AT A PRESCRIBED TEMPERATURE AND PRESSURE

(71) Applicant: Advanced Diamond Holdings, LLC, Beltsville, MD (US)

(72) Inventors: John P. Ciraldo, Chicago, IL (US); Jonathan Levine-Miles, Chicago, IL (US)

(73) Assignee: Advanced Diamond Holdings, LLC, Beltsville, MD (US)

( * ) Notice: Subject to any disclaimer, the term of this patent is extended or adjusted under 35 U.S.C. 154(b) by 0 days.

(21) Appl. No.: 17/153,403

(22) Filed: Jan. 20, 2021

(65) Prior Publication Data

US 2021/0222323 A1 Jul. 22, 2021

Related U.S. Application Data

(60) Provisional application No. 62/963,231, filed on Jan. 20, 2020.

(51) Int. Cl.
 *C30B 25/20* (2006.01)
 *C30B 25/16* (2006.01)
 (Continued)

(52) U.S. Cl.
 CPC .............. *C30B 25/20* (2013.01); *C30B 25/16* (2013.01); *C30B 25/22* (2013.01); *C30B 29/04* (2013.01)

(58) Field of Classification Search
 CPC ......... C30B 25/00; C30B 25/02; C30B 25/10; C30B 25/16; C30B 25/165; C30B 25/18;
 (Continued)

(56) References Cited

U.S. PATENT DOCUMENTS 5,236,545 A * 8/1993 Pryor ...................... C30B 25/18
427/586
5,474,021 A * 12/1995 Tsuno ..................... C30B 25/02
117/97

(Continued)

FOREIGN PATENT DOCUMENTS

CN 103180241 A 6/2013
EP 2516701 B1 8/2016

(Continued)

OTHER PUBLICATIONS

International Search Report and Written Opinion for PCT/US2021/14154, mailed Apr. 21, 2021 (13 pages).

(Continued)

*Primary Examiner* — Kenneth A Bratland, Jr.
(74) *Attorney, Agent, or Firm* — Nutter McClennen & Fish LLP (57) ABSTRACT

A method forms one or more diamonds. The method provides a growth chamber having a gas environment. A single crystal diamond substrate is positioned within the growth chamber. Diamond material is deposited on the single crystal diamond substrate for epitaxial growth. The single crystal diamond substrate has a given crystal orientation. Growth is continued at a prescribed temperature, prescribed pressure, and with a prescribed gas content for the gas environment. The prescribed gas environment has a nitrogen concentration of greater than about 0.5 ppm and less than about 5.0 ppm. The prescribed temperature is greater than about 650 degrees C. and less than about 950 degrees C. The prescribed pressure is greater than about 130 Torr and less than about 175 Torr.

18 Claims, 5 Drawing Sheets

(51) Int. Cl.
*C30B 25/22* (2006.01)
*C30B 29/04* (2006.01)

(58) Field of Classification Search
CPC ......... C30B 25/20; C30B 25/22; C30B 29/00;
C30B 29/02; C30B 29/04; C23C 16/22;
C23C 16/26; C23C 16/27; C23C 16/272;
C23C 16/279
USPC ................ 117/84, 88–89, 92, 103–105, 108,
117/928–929
See application file for complete search history.

(56) References Cited

U.S. PATENT DOCUMENTS

| | | | |
|---|---|---|---|
| 9,518,338 B2 * | 12/2016 | Scarsbrook | ............. C30B 33/00 |
| 2004/0229464 A1 * | 11/2004 | Godfried | ................... C30B 9/00 |
| | | | 438/689 |
| 2007/0157875 A1 | 7/2007 | Hemley et al. | |
| 2008/0311024 A1 | 12/2008 | Meguro et al. | |
| 2010/0126406 A1 | 5/2010 | Yan et al. | |
| 2010/0242834 A1 * | 9/2010 | Bhandari | .............. C30B 25/105 |
| | | | 117/97 |
| 2011/0151226 A1 | 6/2011 | Twitchen et al. | |
| 2014/0137795 A1 | 5/2014 | Chang et al. | |
| 2015/0240381 A1 | 8/2015 | Linares et al. | |
| 2017/0009376 A1 * | 1/2017 | Khan | ................... C30B 25/105 |
| 2018/0236515 A1 | 8/2018 | Nishibayashi et al. | |

FOREIGN PATENT DOCUMENTS

| | | |
|---|---|---|
| WO | 2019222458 A1 | 11/2019 |
| WO | 2020008044 A1 | 1/2020 |

OTHER PUBLICATIONS

European Patent Office, Partial Supplementary European Search Report and Provisional Opinion for European Application No. 21743970.2 dated Apr. 8, 2024, 15 pages.

* cited by examiner

METHOD OF GROWING BULK SINGLE CRYSTAL DIAMOND ON A SUBSTRATE IN A PRESCRIBED GAS ENVIRONMENT AT A PRESCRIBED TEMPERATURE AND PRESSURE

PRIORITY

This patent application claims priority from provisional U.S. patent application No. 62/963,231, filed Jan. 20, 2020, entitled, "METHOD OF GROWING LARGER DIAMONDS," and naming John Ciraldo and Jonathan Levine-Miles as inventors, the disclosure of which is incorporated herein, in its entirety, by reference.

FIELD OF THE INVENTION

Illustrative embodiments of the invention generally relate to growing crystals and, more particularly, illustrative embodiments relate to growing large diamonds using a chemical vapor deposition process.

BACKGROUND OF THE INVENTION

Diamonds are used in a wide variety of applications. For example, they can be used for producing integrated circuits, or as lenses for laser systems. They also can be used simply as gemstones. Fabricating diamonds, however, can produce a number of technical challenges.

SUMMARY OF VARIOUS EMBODIMENTS

In accordance with one embodiment of the invention, a method forms one or more diamonds. The method provides a growth chamber having a gas environment. A single crystal diamond substrate is positioned within the growth chamber. Diamond material is deposited on the single crystal diamond substrate for epitaxial growth. The single crystal diamond substrate has a given crystal orientation. Growth is continued at a prescribed temperature, prescribed pressure, and with a prescribed gas content for the gas environment. The prescribed gas environment has a nitrogen concentration of greater than about 0.5 ppm and less than about 5.0 ppm. The prescribed temperature is greater than about 650 degrees C. and less than about 950 degrees C. The prescribed pressure is greater than about 130 Torr and less than about 175 Torr.

Among other ways, depositing includes using plasma assisted chemical vapor deposition techniques. In some embodiments, the gas environment is free of oxygen. However, in some embodiments, the gas environment may include one or more of oxygen, argon, methane, and hydrogen. In some embodiments, the prescribed temperature and/or the prescribed pressure varies when continuing growth.

Using the above described method, a diamond may be formed from that has a maximum dimension of greater than about 15 millimeters. Furthermore, a plurality of diamonds may be produced simultaneously. Epitaxial growth may be performed on the diamond surface. The diamond growth surface may have a (100) crystal orientation with a miscut/misorientation in the range of about ±5 degrees In accordance with yet another embodiment, a method grows one or more diamonds. The method provides a seed in a growth chamber. The seed has a (100) crystal orientation with a miscut of about + or −5 degrees. A gas concentration in the growth chamber is set to be between about 1.5 ppm and about 5.0 ppm for a first period of time. A temperature in the growth chamber is set to be between about 650 C and 1100 C. A pressure in the growth chamber is set to be between about 135 Torr and 175 Torr.

The first period of time may be between about 1 hour and 48 hours. The gas concentration in the growth chamber may be set between about 0.5 ppm and about 1.5 ppm for a second period of time after the first period of time. The second period of time may be between about 350 hours and about 750 hours. Diamond layers may be deposited to form a bulk diamond of between about 3.5 carats and about 9 carats.

In some embodiments, a diamond layer is epitaxially grown on the seed. Diamond layers may be grown heteroepitaxially or homoepitaxially. The seed may be a diamond seed. The bulk diamond may be formed continuously. For example, growth may not be stopped to remove undesirable polycrystalline material. In some embodiments, layers may be deposited to form a bulk diamond of between about 10 carats and about 20 carats.

Furthermore, a second diamond layer may be grown directly or indirectly on the first diamond layer. The second diamond layer preferably has a greater diameter, width and/or length than the first diamond layer. Thus, diamond layers may be grown outwardly.

In accordance with yet another embodiment, a method continuously grows one or more diamonds. The method provides a growth chamber having a gas environment. A single crystal substrate is positioned within the growth chamber. Diamond material is deposited on the single crystal substrate for epitaxial growth. Diamond layers are grown at a prescribed temperature, prescribed pressure, and with a prescribed gas content for the gas environment. The prescribed gas environment may have a nitrogen concentration of greater than zero percent but less than about 0.0005 percent. The prescribed temperature may be greater than about 750 degrees C. and less than about 1150 degrees C.

In some embodiments, diamond layers may be grown for 350-750 hours to produce a bulk diamond of between about 3.5 carats and about 20 carats. Each successive grown diamond layer may have a maximum dimension that is greater than a maximum dimension of a previous diamond layer on which it was growth. Furthermore, in various embodiments, the diamond layers may be grown without stopping the growth process to remove polycrystalline material. In some embodiments, the prescribed pressure may be greater than about 100 Torr and less than about 200 Torr.

Various embodiments may be directed to a system (e.g., including a growth chamber) that is configured to grow diamonds in accordance with one or more of the various methods described herein. Additionally, or alternatively, various embodiments may be directed to diamonds grown using one or more of the various methods herein. For example, illustrative embodiments may include a diamond of about 3.5 carats to about 20 carats that is grown continuously (e.g., has not been processed to remove polycrystalline material).

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, large diamonds are grown using a process that improves growth rate. The process advantageously reduces the growth of undesirable polycrystalline carbon, which may otherwise grow, by providing favorable growth conditions inside a growth chamber. In particular, the inventors discovered that one or more of a gas chemistry, a temperature, a pressure, and a crystal orientation of a seed inside the chamber can be set to reduce the growth of polycrystalline material. Details of illustrative embodiments are discussed below.

Figure 1A:
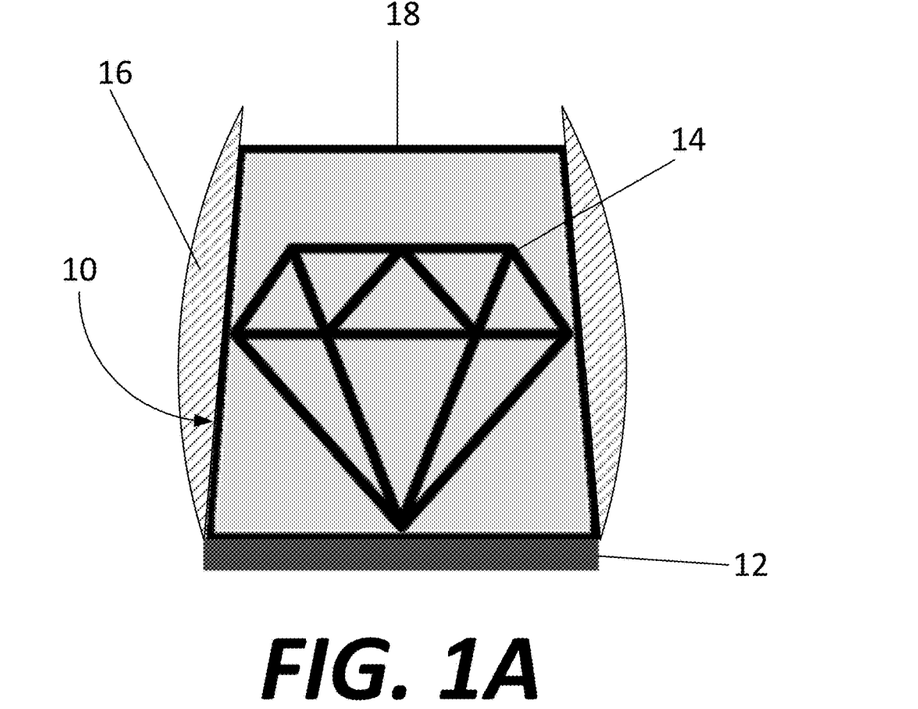
FIG. 1A schematically shows bulk diamond grown using chemical vapor deposition in accordance with illustrative embodiments of the invention.

FIG. 1A schematically shows bulk diamond 10 grown using chemical vapor deposition in accordance with illustrative embodiments of the invention. As known by those of skill in the art, the diamond 10 is grown epitaxially on a single-crystal seed 12 (e.g., a single-crystal diamond seed 12). Ultimately, a cut diamond 14 may be cut from the bulk diamond 10. However, as shown in FIG. 1A, the size of the cut diamond 14 is limited by the dimensions of the bulk diamond 10. Furthermore, as known by those in the art, during epitaxial growth, polycrystalline material 16 begins to form on the peripheries of the diamond 10 (and sometimes on a growth surface 18 of the diamond 10). As the polycrystalline material 16 begins to grow on the peripheries of the growth surface 18, the diameter/width of every subsequent layer of the bulk diamond 10 becomes smaller and smaller, as monocrystalline diamond 10 is not able to grow on polycrystalline material 16.

Figure 1B:
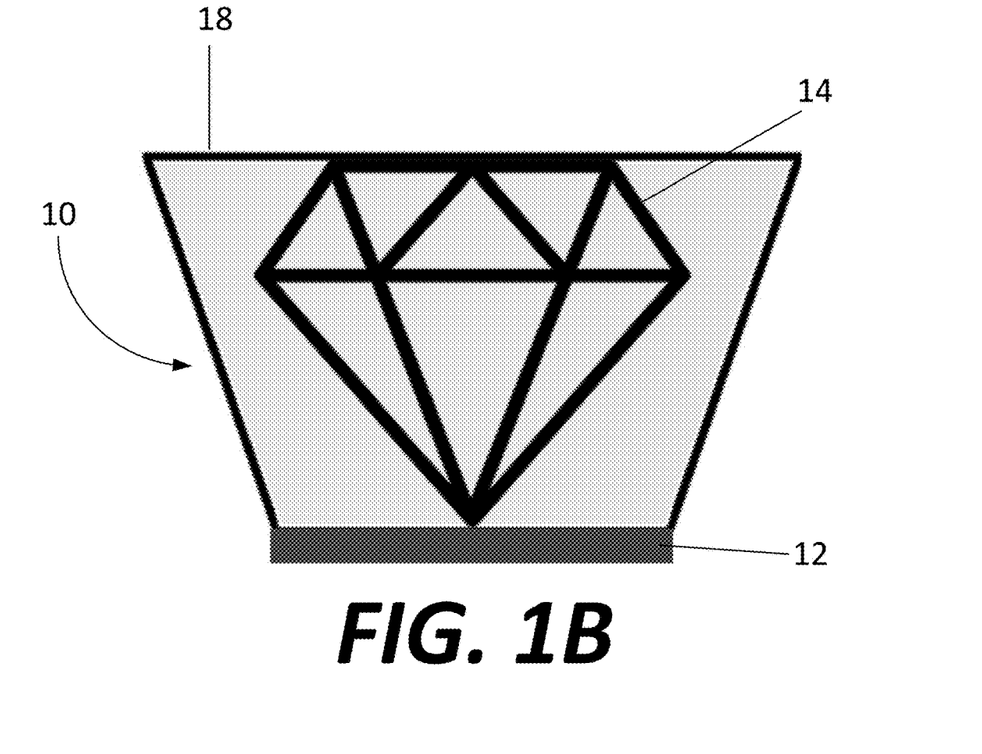
FIG. 1B schematically shows larger bulk diamond grown using chemical vapor deposition in accordance with illustrative embodiments of the invention.

FIG. 1B schematically shows a larger bulk diamond 10 grown using chemical vapor deposition in accordance with illustrative embodiments of the invention. Advantageously, the growth of polycrystalline material 16 (e.g., polycrystalline carbon) is hindered or prevented. Accordingly, the growth surface 18 is unobstructed by the polycrystalline material 16. Indeed, the bulk diamond 10 is not only able to grow vertically, it is possible to grow the diamond outwards. This results in considerably large bulk diamonds 10, and ultimately, cut diamonds 14.

Figure 2:
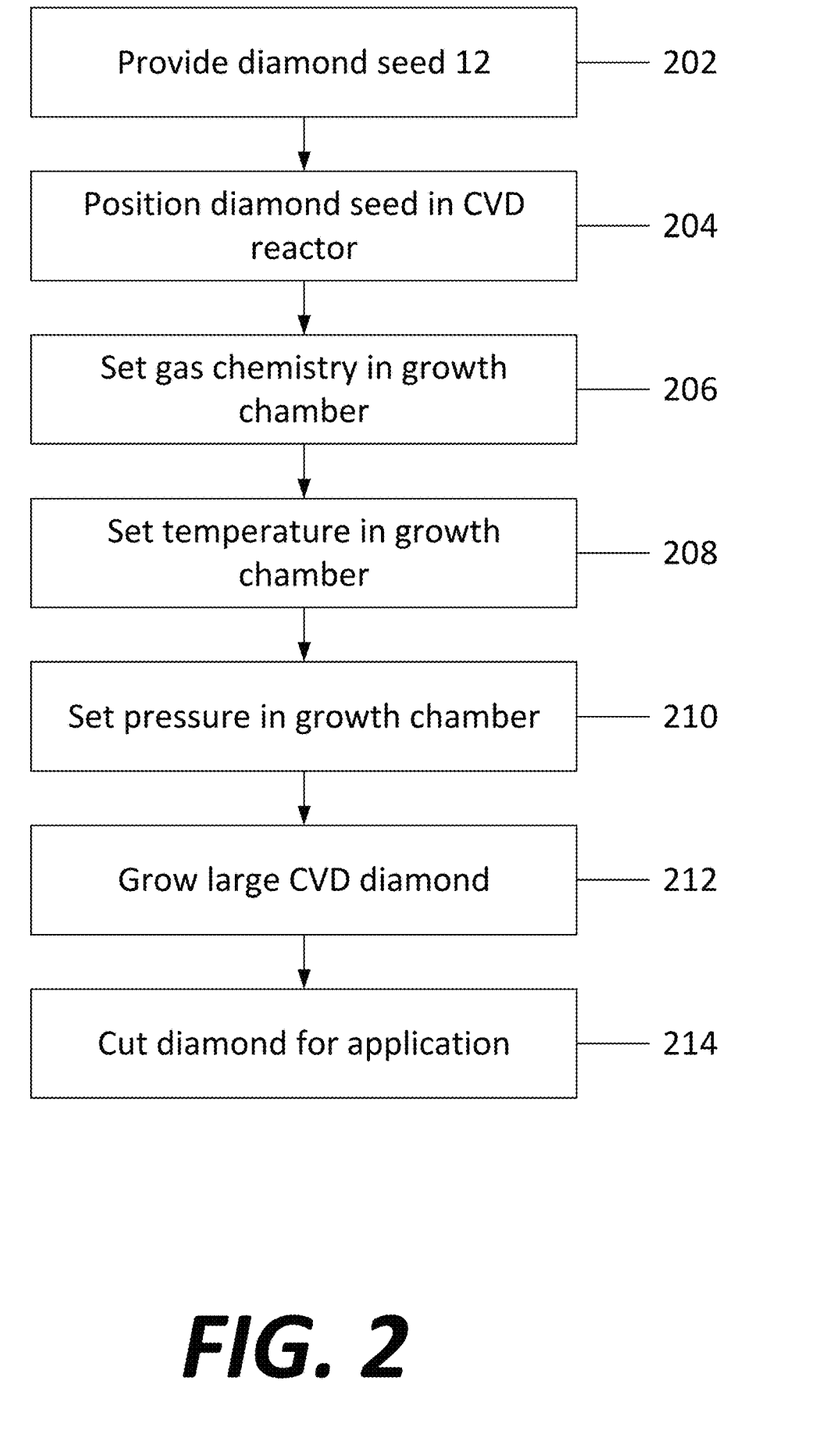
FIG. 2 shows a process of growing the large bulk diamonds in accordance with illustrative embodiments of the invention.

FIG. 2 shows a process of growing the large bulk diamonds 10 shown in FIG. 1B in accordance with illustrative embodiments of the invention. It should be noted that this process is a simplified version of a more complex process growing diamonds 10. As such, the actual process may have additional steps that are not discussed. In addition, some steps may be performed in a different order, or in parallel with each other. Furthermore, in various embodiments, one or more steps may be optional. Accordingly, discussion of this process is illustrative and not intended to limit various embodiments of the invention. Moreover, although this process is discussed primarily with regard to producing a single diamond 10, the process of FIG. 2 also can be used to produce a plurality of diamonds 10 simultaneously (e.g., within the same growth chamber), and/or sequentially.

The process begins at step 202, which provides the diamond seed 12 on which the bulk diamond 10 is grown. The seed 12 may be obtained from natural or grown diamond. For example, the seed 12 may be a thin layer cut (e.g., laser cut) from a diamond 10. The seed 12 is preferably polished (e.g., robotic polishing at 2800 RPM) to achieve a desired crystal orientation. Preferably, the seed 12 does not have any polycrystalline areas or polycrystalline material 16 thereon. In some embodiments, the seed 12 is in the shape of a rectangle (e.g., a square). The seed 12 may have a variety of dimensions. In general, the larger the growth dimensions of the seed, the larger the grown diamond 10. Accordingly, in some embodiments, the seed 12 may have a width and/or a length of about 6 mm to about 15 mm (e.g., about 9 mm).

The inventors discovered that the orientation of the crystal seed 12 impacts the size of the grown diamond 10. As known by those in the art, single crystals are anisotropic. By varying crystal orientation, properties of the grown crystal may be changed. In particular, the inventors have found that a crystal orientation of (100) hinders the growth of polycrystalline material 16. In particular, a misorientation/miscut in a range of ±5 degrees on a (100) surface has been found to substantially reduce instances of polycrystalline material 16 during the growth process, while advantageously enhancing outward growth of the diamond 10 (e.g., growing outwardly at an angle of up to about 45 degrees outwardly).

Other crystal orientations for larger diamond 10 growth include the (110) orientation, with or without the ±5 degrees maximum misorientation. The inventors have found that the (110) orientation hinders growth of the polycrystalline material 16. However, the (110) orientation also hinders outward growth of the diamond 10 (relative to the (100) orientation). Therefore, the (110) orientation lacks some of the same growth advantages as the (100) orientation having the miscut in a range of ±5 degrees (e.g., 2 degrees).

Figure 3:
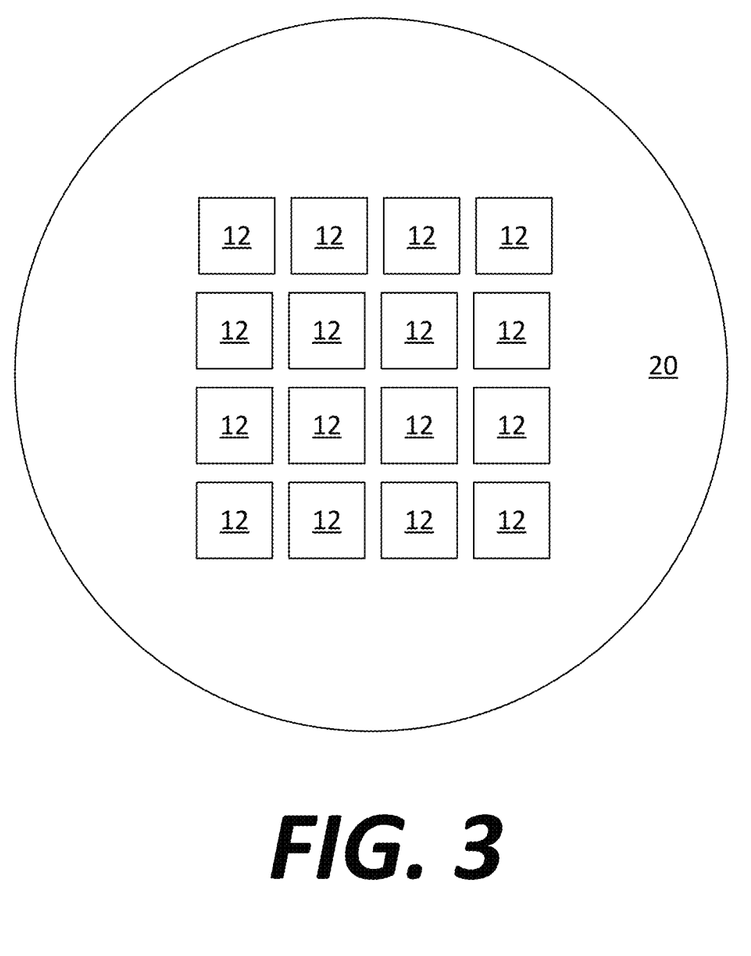
FIG. 3 schematically shows a top view of a platform having seeds positioned thereon for crystal growth in accordance with illustrative embodiments of the invention.

The process proceeds to step 204, which positions the seed 12 on a platform 20 in the diamond growth chamber. FIG. 3 schematically shows a top view of the platform 20 having seeds 12 positioned thereon. Diamonds 10 are grown epitaxially on the seed 12 using chemical vapor deposition. As the diamond 10 is grown, the top surface of the diamond 10 may also be referred to as the growth surface 18. Thus, the growth surface 18 may have the miscut, in the range of about ±5 degrees, that originated from the seed 12.

In some embodiments, as shown in FIG. 3, a plurality of seeds 12 may be positioned within the reactor. For example, two or more seeds may be positioned on the platform 20. In some embodiments between about 16 and about 32 seeds 12 may be simultaneously positioned on the platform 20. Although the seeds 12 are shown as having some distance between them on the platform 20, in some embodiments, the seeds 12 may be positioned so that their edges abut one another. This "mosaic approach" uses a plurality of square diamond seeds 12 that are in contact with each other to form a "larger" seed 12. As such, diamond 10 films deposited upon the seeds 12 may be continuous across the seeds 12. The mosaic technique, however, suffers from several challenges, including poor repeatability and high crystalline defect density in the as-grown films (i.e., as-grown layers) near the junctions of the individual seeds 12. To assist with growing across seeds 12, illustrative embodiments may advantageously keep the nitrogen concentration in the chamber at about 1.5 ppm to about 5 ppm (e.g., 2 ppm) for about 1 hour to about 48 hours (e.g., 24 hours) to assist with growing the diamond 10 layers together.

At step 206, the gas chemistry in the CVD growth chamber is set to create favorable growing conditions. In particular, a concentration of nitrogen is adjusted/set such that it is about 0.5 ppm to about 5.0 ppm of the total gas concentration in the chamber. The inventors found that this range of nitrogen, in consideration with other factors discussed herein, enables outward growth of diamonds 10.

Figure 4:
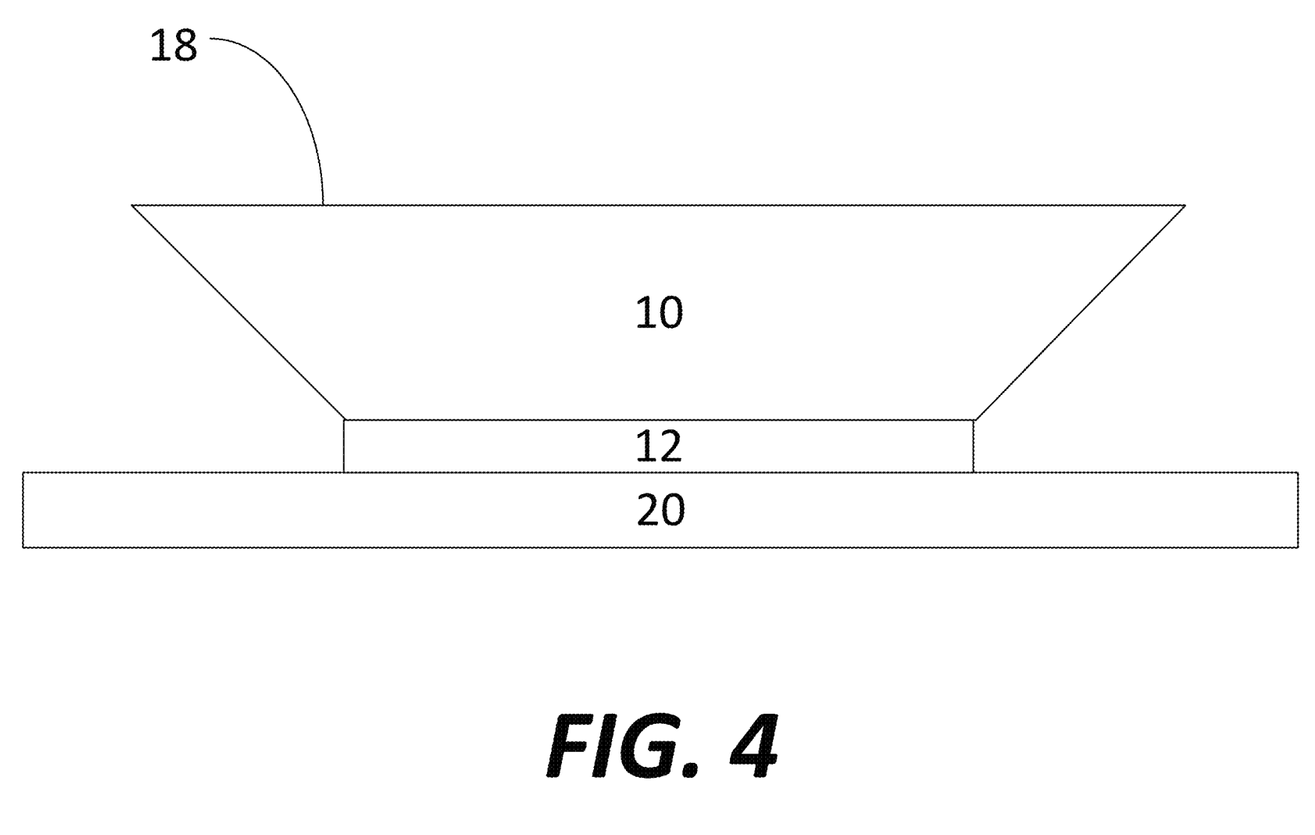
FIG. 4 shows a side view of the diamond grown in accordance with illustrative embodiments of the invention.

FIG. 4 shows a side view of the diamond 10 grown in accordance with illustrative embodiments of the invention. As shown, the diamond 10 grows from the seed 12 outwardly (e.g., at an angle of about 45 degrees). In various embodiments, diamond 10 layers may grow outwardly at an angle of about 1 degree to about 45 degrees. In some embodiments, the growth is isotropic (e.g., degrees). Thus, the growth surface 18, and subsequent diamond 10 layers, ultimately grow to become larger than the initial seed 12 (e.g., a larger width and length, diameter, etc.).

When the concentration of nitrogen is higher than about 5.0 ppm, the diamond 10 begins to grow vertically rather than outwardly. Meaning, the diamond 10 may not grow outwardly to the same extent as a lower nitrogen concentration. On the other end of the range, nitrogen concentrations of less than 0.5 ppm have been found to have a negligible effect on outward growth.

Another consideration is that higher nitrogen concentrations tend to provide undesirable (depending on application) colors for gemstones (i.e., not colorless). While a range of diamond 10 colors may be acceptable, the aforementioned nitrogen concentrations may create diamonds having a diamond color of D, E, or F on the GIA (Gemological Institute of America) scale. Accordingly, some embodiments may use a nitrogen concentration of between about 0.5 ppm and 1.5 ppm.

In some embodiments, the concentration of nitrogen may be varied throughout the growth cycle. For example, the concentration of nitrogen may be up to 2 ppm for a first period of time (e.g., the first 24 hours). The concentration of nitrogen may then be dropped to about 1 ppm for a second period of time (e.g., 350-720 hours). By starting with a higher initial concentration for the first period of time, the outward growth of the crystal is assisted in the beginning of the process. This is particularly helpful when using the mosaic approach, as the seeds 12 (e.g., 16-36 seeds) are able to come together more quickly, reducing the likelihood that the seeds 12 undesirably will move from their initial position (e.g., which may otherwise occur during slower growth). By growing the seeds 12 in the higher nitrogen environment (e.g., about 2 ppm to about 5 ppm), the diamond 12 is grown as a single plate that spans across all of the seeds 12. This helps reduce or prevent defects that might propagate from the seed 12. In some embodiments, the higher nitrogen concentration may be present for a few hours before the concentration is lowered to less than about 2 ppm. Accordingly, in some embodiments, the first period of time may be less than 24 hours, less than 12 hours, less than 6 hours, or about 3 hours.

Returning to the process of FIG. 2, the temperature in the growth chamber is set at step 208. Illustrative embodiments set and/or maintain the temperature in the growth chamber in the range of about 650 C to about 950 C. The inventors have discovered that temperatures lower than 650 C cause the diamond 10 to grow large, but the quality of the diamond 10 is low. On the other hand, temperatures of greater than about 950 C create a high quality diamond, but it is difficult to grow a large diamond 10. In particular, higher temperatures provide excellent growth conditions for polycrystalline material 16. As described previously, however, polycrystalline material 16 prevents the diamond 16 from growing outwardly. Some embodiments may heat the chamber at about 1100 C to about 1200 C to create high quality diamonds, but with a smaller size.

Preferably, illustrative embodiments set and/or maintain the temperature in the growth chamber in the range of about 750 C to about 850 C. The inventors determined that this range provides excellent quality diamond 10 while allowing for isotropic outward growth.

The process proceeds to step 210, which sets the pressure in the growth chamber. Illustrative embodiments maintain the pressure in the chamber at a range of between about 100 Torr to 200 Torr to optimize growth conditions. The inventors determined that pressures at the higher end of the range cause the diamond 10 to grow faster. However, in a manner similar to temperature, polycrystalline material 16 growth is proportional to increased pressure. Thus, as pressure (or temperature) is increased beyond certain ranges, the diameter/width of the diamond 10 decreases as it grows (e.g., see FIG. 1A). Accordingly, in some embodiments, maintaining the pressure in the chamber at a range of between about 135 Torr and about 175 Torr may be advantageous (e.g., if temperature is at the higher end of the ranges described herein).

The process then proceeds to step 212, which grows large diamonds 10 using chemical vapor deposition. The diamond 10 may be grown using the aforementioned crystal orientation, gas chemistry, temperature ranges, and/or pressure ranges.

It should be understood that illustrative embodiments enable the continuous growth of large diamonds (i.e., without stopping the growth to remove polycrystalline material 16). Accordingly, illustrative embodiments may grow diamonds 10 of greater than 3.5 carats continuously. Some embodiments may grow diamonds 10 of between about 5 carats and 6 carats continuously (e.g., in about 700-750 hours). Illustrative embodiments may grow large diamonds 10 of up to 9 carats, or greater. For example, some embodiments may grow diamonds of between about 10 carats and about 20 carats. Continuous growth of large diamonds 10 enables scalability of diamond 10 growth without requiring starting and stopping the growth process to remove polycrystalline material 16. Accordingly, illustrative embodiments may grow large diamonds more quickly and with fewer steps than prior art processes.

Furthermore, the conditions inside the chamber may be varied during the growth of the diamond 10. For example, some embodiments may advantageously grow diamond 10 at the lower end of the temperature and pressure ranges described herein for some first period of time. After a certain amount of growth, temperature and/or pressure may be increased to higher ends of the ranges described herein. Although the diamond may no longer grow outwardly at higher ends of these ranges, this change in growth may be used advantageously. As shown in FIGS. 1A-1B, the cut diamond 14 generally tapers towards the top. Thus, illustrative embodiments may increase the growth rate and decrease the diameter/width of the bulk diamond 10, while still maintaining a given size cut diamond 14. For example, for a particular cut diamond 14 size, the tapering point may be predetermined. After the bulk diamond 10 has been grown to the tapering point or beyond, the settings in the chamber may be adjusted so that the diameter of the diamond 10 may begin to grow faster without growing outwardly. Indeed, the diamond may begin to grow inwardly so long as it does not grow inwardly enough to provide insufficient bulk material for the desired cut diamond 14.

The process then proceeds to step 214, which cuts the diamond 10 for its particular application. Illustrative embodiments provide high quality diamonds, which may be used for jewelry. However, some embodiments may also create diamonds suitable for optical applications, or to be used as seeds 12. In some other embodiments, if multiple seeds 12 were joined together during growth, the diamond 10 may be cut so that the seeds 12 (e.g., in the mosaic pattern) may be separated.

Accordingly, using these techniques, some embodiments produce larger diamonds for use as gemstones, substrate, industrial equipment, etc. For example, some embodiments may produce larger and larger substrates 12 from sequentially produced batches. For example, the noted 9 mm single crystal square seed 12 may be used to produce a larger single crystal square substrate (e.g., 13 mm), which itself can be subsequently used to produce an even larger single crystal substrate 12 (e.g., 19 mm). This process may iterate to produce a suitably sized substrate for a given application. Note that rather than use square substrates 12, some embodiments use non-square rectangularly shaped substrates 12, rounded substrates 12, or substrates 12 with other shapes (e.g., an irregular shape).

Figure 5:
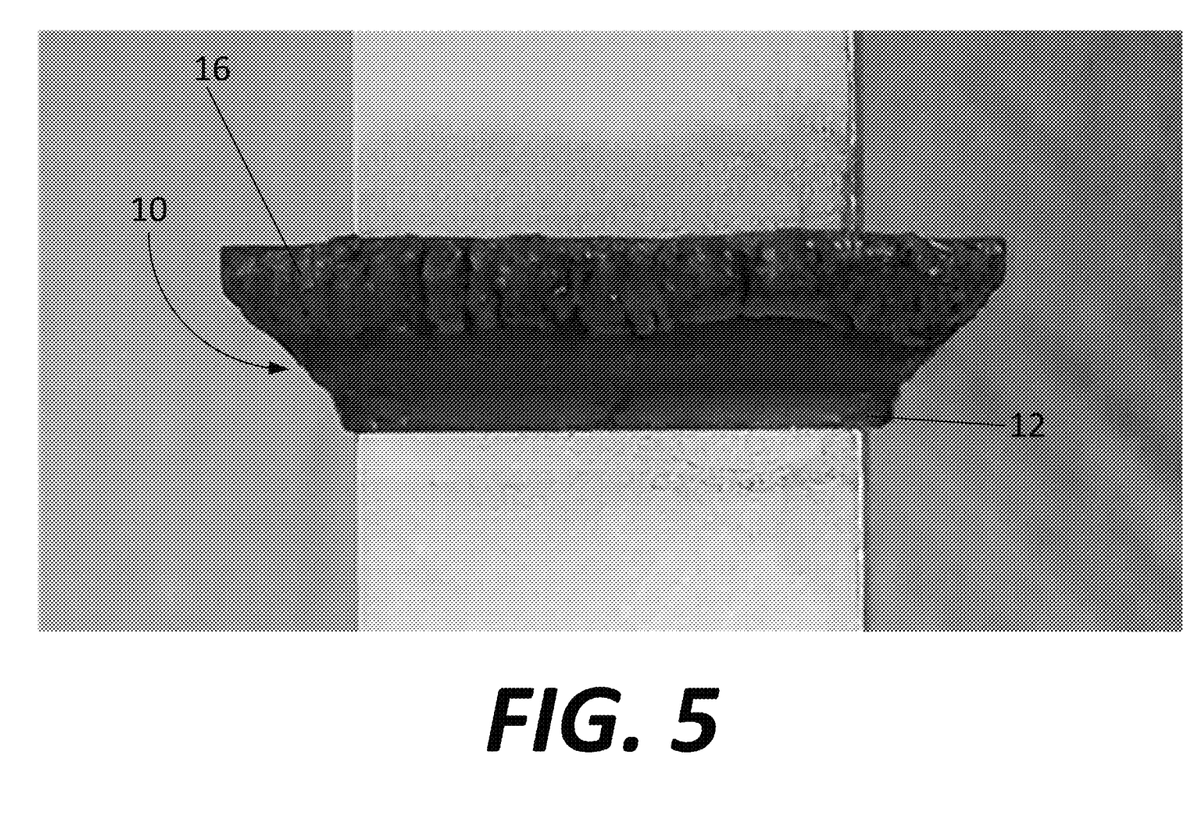
FIG. 5 is a picture of a side view of a diamond grown in accordance with illustrative embodiments of the invention.

Illustrative embodiments preferably use plasma assisted CVD processes with the desired process conditions noted above to produce the single crystal diamonds. FIG. 5 shows a side view of a diamond 10 grown using these processes. The diamond 10 has a relatively rectangular base, which is consistent with the substrate 12, and expands in a tapered fashion outwardly. For example, the taper may be about 45 degrees, in which it grows upwardly by one unit, and outwardly by one unit.

While various embodiments apply to homoepitaxial applications (e.g., growing diamond layers on a diamond seed), other embodiments apply to heteroepitaxial applications (e.g., growing diamond layers on a non-diamond seed). Such applications may mitigate formation of polycrystalline material near the substrate edges. It should also be understood that while the above discussion refers to growing large diamonds, in some embodiments, non-diamond material may also be grown in a similar manner under the conditions described herein.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming one or more diamonds, the method comprising:
   providing a growth chamber having a gas environment;
   positioning a single crystal diamond substrate within the growth chamber;
   depositing diamond material on the single crystal diamond substrate for epitaxial growth, the single crystal diamond substrate having a given crystal orientation;
   growing single crystal diamond outwardly on the single crystal diamond substrate at a prescribed temperature, prescribed pressure, and with a prescribed gas content for the gas environment to produce a bulk single crystal diamond,
   the prescribed gas environment having a nitrogen concentration of 2 ppm to 5 ppm for a first growth period, the prescribed temperature being greater than 650 degrees C. and less than 950 degrees C.,
   the prescribed pressure being greater than 130 Torr and less than 175 Torr;
   altering the prescribed gas environment to have the nitrogen concentration of 0.5 ppm to 1.5 ppm for a second growth period after the first growth period.

2. The method of claim 1 wherein depositing comprises using plasma assisted chemical vapor deposition techniques.

3. The method of claim 1 wherein the gas environment is free of oxygen.

4. The method of claim 1 wherein the gas environment includes one or more of oxygen, argon, methane, and hydrogen.

5. The method of claim 1 wherein a diamond formed from depositing the diamond material has a maximum dimension of greater than 15 millimeters.

6. The method of claim 1 further comprising producing a plurality of diamonds simultaneously.

7. The method of claim 1 wherein growth is performed on the diamond surface.

8. The method of claim 1 wherein the prescribed temperature varies when continuing growth.

9. The method of claim 1 wherein the prescribed pressure varies when continuing growth.

10. The method of claim 1 wherein a growth surface of the diamond has a (100) orientation with a miscut/misorientation in the range of ±5 degrees.

11. A method of growing one or more single-crystal diamond, the method comprising:
   providing a substrate in a growth chamber, the substrate having a (100) crystal orientation with a miscut of + or −5 degrees;
   setting a nitrogen gas concentration in the growth chamber to be between 2.0 ppm and 5.0 ppm for a first period of time;
   setting a temperature in the growth chamber to be between 650 C and 1100 C;
   setting a pressure in the growth chamber to be between 135 Torr and 175 Torr;
   growing a first single-crystal diamond layer on the substrate;
   changing the nitrogen gas concentration in the growth chamber to be between 0.5 ppm and 1.5 ppm for a second period of time after the first period of time;
   growing a second single-crystal diamond layer directly or indirectly on the first single-crystal diamond layer, the second single-crystal diamond layer having a greater width and/or length than the first single-crystal diamond layer.

12. The method as defined by claim 11, wherein the first period of time is between 1 hour and 48 hours.

13. The method as defined by claim 11, wherein the second period of time is between 350 hours and 750 hours.

14. The method as defined by claim 11, further comprising depositing layers to form a bulk diamond of between 3.5 carats and 9 carats.

15. The method as defined by claim 14, wherein the bulk diamond is formed continuously.

16. The method as defined by claim 11, further comprising depositing layers to form a bulk diamond of between 10 carats and 20 carats.

17. The method as defined by claim 11, further comprising growing diamond layers outwardly.

18. The method as defined by claim 11, wherein the seed is a diamond seed.

* * * * *